(12) United States Patent
Chen

(10) Patent No.: US 6,406,961 B1
(45) Date of Patent: Jun. 18, 2002

(54) PROCESS FOR PRODUCING FLASH MEMORY WITHOUT MIS-ALIGNMENT OF FLOATING GATE WITH FIELD OXIDE

(75) Inventor: Bin-Shing Chen, Hsinchu (TW)

(73) Assignee: Winbond Electronics Corporation, Hsinchu (TW)

( * ) Notice: Subject to any disclaimer, the term of this patent is extended or adjusted under 35 U.S.C. 154(b) by 60 days.

(21) Appl. No.: 09/731,511

(22) Filed: Dec. 7, 2000

(30) Foreign Application Priority Data

Oct. 6, 2000 (TW) .................................... 89120960 A

(51) Int. Cl.⁷ .......................................... H01L 21/8247
(52) U.S. Cl. ..................... 438/266; 438/264; 438/257
(58) Field of Search ................................. 438/257–267

(56) References Cited

U.S. PATENT DOCUMENTS

| | | |
|---|---|---|
| 5,029,130 A | 7/1991 | Yeh |
| 5,045,488 A | 9/1991 | Yeh |
| 5,242,848 A | 9/1993 | Yeh |
| 5,891,773 A * | 4/1999 | Saitoh ........................ 438/259 |

* cited by examiner

*Primary Examiner*—Richard Booth
(74) *Attorney, Agent, or Firm*—Matthews, Collins, Shepherd & McKay, P.A.

(57) ABSTRACT

A process for producing a memory structure is disclosed. According to the process, an insulating portion and a conductive portion are formed with substantially equal thickness, and arranged in an alternate way to be a field oxide structure and a floating gate structure. This can be achieved by applying a conductive layer first, creating a trench in the conductive layer, filling the trench with an insulating material, and polishing the resulting layer. Because the insulating portion is formed adjacent to the conductive portion by filling the insulating material in the trench adjacent to the conductive portion, the field oxide structure and the floating gate structure are self-aligned while forming. Accordingly, no mis-alignment occurs, and thus the integration of the device can be improved. On the other hand, owing to the substantially equal thickness of the field oxide structure and the floating gate structure, the coupling effect between the floating gate structure and the control gate structure overlying the field oxide and the floating gate structures is well controlled, and thus the voltage for a programming or an erasing operation can be reduced.

16 Claims, 12 Drawing Sheets

PROCESS FOR PRODUCING FLASH MEMORY WITHOUT MIS-ALIGNMENT OF FLOATING GATE WITH FIELD OXIDE

FIELD OF THE INVENTION

The present invention relates to a process for producing a memory, and more particularly to a process for producing a flash memory which involves in self alignment of a floating gate structure with a field oxide structure.

BACKGROUND OF THE INVENTION

Among various types of non-volatile memories, an electrically erasable programmable read only memory is more and more popular, and especially a flash memory is developing significantly.

Please refer to FIGS. 1A~1H which schematically show a conventional process for producing a flash memory. First of all, a pad oxide layer 101, a silicon nitride layer 102 and a photoresist layer 103 are sequentially formed on a silicon substrate 100, as shown in FIG. 1A. Using a first photo-masking and lithography procedure to pattern the silicon nitride layer 102 to obtain a mask 12, as shown in FIG. 1B. With the shield of the mask 12, a field oxide (FOX) structure 104 are grown, as shown in FIG. 1C. The silicon nitride mask 12 and the pad oxide 101 thereunder are then removed to expose the substrate 100 to complete the definition of an active area 105, as shown in FIG. 1D. Over the substrate with the active area 105, a tunnel oxide layer 106, a doped polysilicon layer 107, another silicon nitride layer 108 and another photoresist 109 are sequentially formed, as shown in FIG. 1E. Using a second photo-masking and lithography procedure to pattern the silicon nitride layer 108 to obtain a mask 18, as shown in FIG. 1F. With the shield of the mask 18, an oxide structure 110 and a floating gate structure 111 are defined, and then the mask 18 is removed, as shown in FIG. 1G. Subsequently, another doped polysilicon layer is applied to the resulting substrate to define a control gate structure 112, as shown in FIG. 1H. A top plane view of the resulting structure is schematically shown in FIG. 2 wherein the cross-sectional view of FIG. 1H is taken along the A–A' line of FIG. 2. For further illustration, a cross-sectional view taken along the B–B' line of FIG. 2 is shown in FIG. 3 which also shows source/drain regions 13 defined later.

It is understood from the above description, the formation of the field oxide structure and the floating gate structure are performed by respective masking and lithography procedures. Therefore, mis-alignment may occur between the field oxide structure and the floating gate structure so as to result in a poor yield. In order to solve this problem, it is necessary to remain a clearance, e.g. about 0.1~0.15 microns for each side, between the field oxide structure and the floating gate structure for tolerance. As known, such a clearance has an adverse effect on the integration of the device. On the other hand, the relatively large coupling effect between the floating gate and the control gate requires a relatively high voltage to perform a programming or erasing operation, thereby increasing the difficulty in performing these operations.

SUMMARY OF THE INVENTION

Therefore, an object of the present invention is to provide a process for producing a memory structure without mis-alignment between the field oxide structure and the floating gate structure.

Another object of the present invention is to provide a process for producing a memory structure with a reduced coupling effect between the floating gate and the control gate.

According to a first aspect of the present invention, a process for producing a memory structure, includes steps of: providing a substrate; sequentially applying a tunnel dielectric layer and a first conductive layer onto the substrate; creating a trench in the first conductive layer; applying a first insulating layer onto the first conductive layer, which fills the trench; creating an implanting window in the first insulating layer; defining a source region on the substrate through the implanting window; applying a masking layer onto the substrate with the first conductive layer, the first insulating layer and the implanting window, and etching the masking layer to form a patterned mask; reacting a portion of the first conductive layer without the shield of the patterned mask to form a second insulating layer, and removing the patterned mask, and an unreacted portion of the first conductive layer exposed from the shield of the patterned mask, thereby forming a floating gate structure; forming an insulating spacer structure around the floating gate structure; applying a second conductive layer onto the substrate with the second insulating layer and the insulating spacer structure, and etching the second conductive layer to form a control gate structure; and defining a drain region on the substrate.

In an embodiment, the substrate is a silicon substrate, the tunnel dielectric layer is a silicon oxide layer, the first conductive layer is a doped polysilicon layer, the masking layer is a silicon nitride layer, the insulating spacer structure is formed of silicon nitride, and the second conductive layer is a doped polysilicon layer.

Preferably, the first insulating layer is applied onto the first conductive layer by chemical vapor deposition.

Preferably, the first insulating layer is further treated by a planarization procedure, e.g. a chemical mechanical polishing procedure.

Preferably, the second insulating layer is formed by a thermal oxidation procedure.

According to another aspect of the present invention, a process for producing a memory structure, includes steps of: providing a substrate; applying a tunnel dielectric layer onto the substrate; applying a first conductive layer onto the tunnel dielectric layer, which is trenched to include alternate trench portion and conductive portion; filling the trench portion with a first insulating material to form a first insulating structure beside the conductive portion; removing a portion of the first insulating structure to create an implanting window through which ion-implantation is performed to define a source region; masking the conductive portion according to a predetermined pattern, and transforming the un-masked conductive portion into a top-insulated conductive portion; removing the masked conductive portion to isolate the top-insulated conductive portion to form a floating gate structure; forming an insulating spacer structure around the floating gate structure; applying a second conductive layer over the floating gate structure, which is patterned to form a control gate structure; and defining a drain region on the substrate.

Preferably, the un-masked conductive portion is transformed into a top-insulated conductive portion by a thermal oxidation procedure.

According to a third aspect of the present invention, a process for producing a memory structure, includes steps of: providing a substrate; applying a tunnel dielectric layer onto the substrate; forming a floating gate layer on the tunnel dielectric layer, which includes alternate insulating portion and conductive portion of substantially equal thickness; creating an implanting window in the insulating portion for performing ion-implantation therethrough to define a source region; removing a part of the conductive portion to form a floating gate structure; providing an insulating material around the floating gate structure; applying a control gate layer over the floating gate structure, which is patterned to form a control gate structure; and defining a drain region on the substrate.

Preferable, the formation of the floating gate layer includes steps of: applying a conductive layer onto the tunnel dielectric layer; creating a trench in the conductive layer; forming an insulating layer on the substrate with the trench and the conductive layer, which fills the trench; and performing a polishing procedure to make the insulating portion and the conductive portion have a substantially equal thickness. Preferably, the insulating structure around the floating gate structure includes a top insulating portion formed by thermal oxidation of a second portion of the conductive portion before the first portion of the conductive portion is removed; and a spacer insulating portion formed beside the second portion of the conductive portion after the first portion of the conductive portion is removed.

BRIEF DESCRIPTION OF THE DRAWINGS

The present invention may best be understood through the following description with reference to the accompanying drawings, in which:

FIGS. 4A~4L are schematic cross-sectional views of intermediate structures of a flash memory according to a preferred embodiment of the present invention, wherein FIGS. 4A~4G show the changes of a first cross section taken along a C–C' line of FIG. 5, FIG. 4H shows the change of a second cross-section taken along a D–D' line of FIG. 5, FIG. 4I shows the change of a third cross-section taken along an E–E' line of FIG. 5, and FIGS. 4J~4L show the changes of a fourth cross section taken along an F–F' line of FIG. 5.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1A:
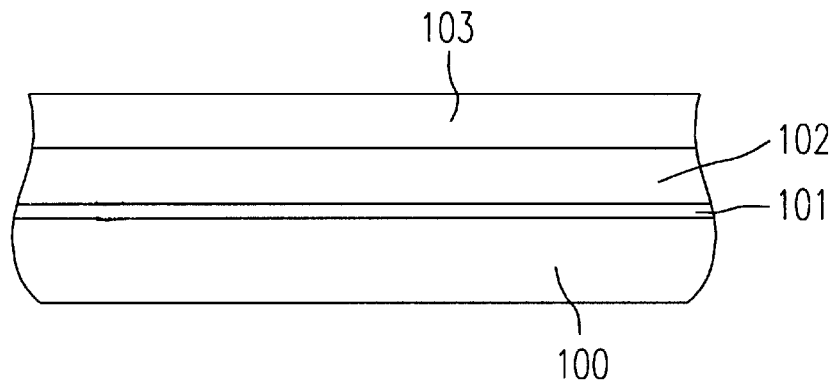
FIGS. 1A~1H are schematic cross-sectional views of intermediate structures of a conventional flash memory.
Figure 1B:
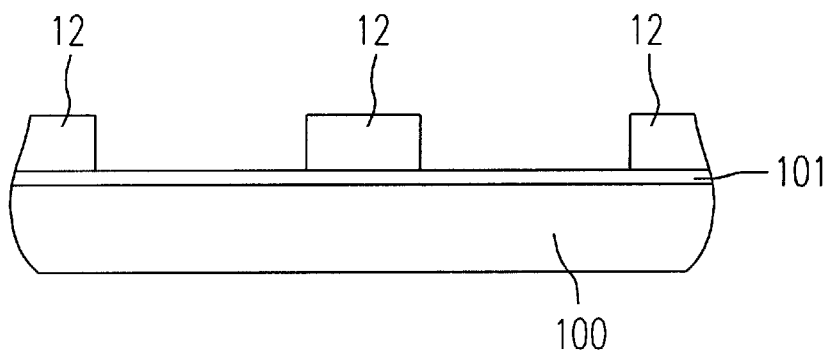
Figure 1C:
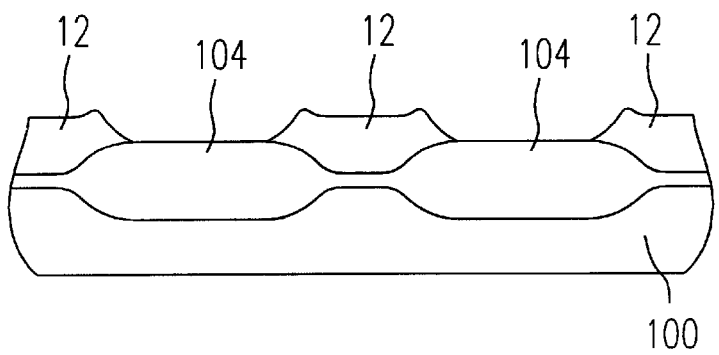
Figure 1D:
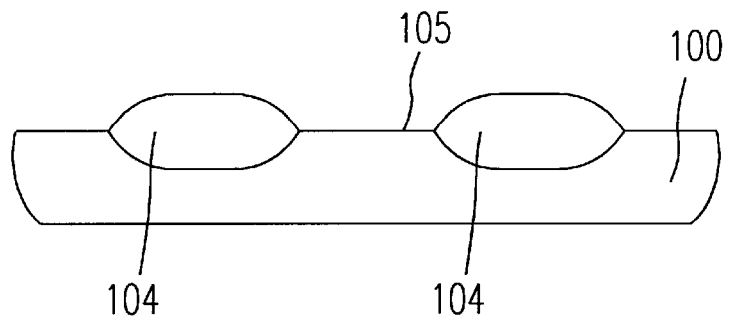
Figure 1E:
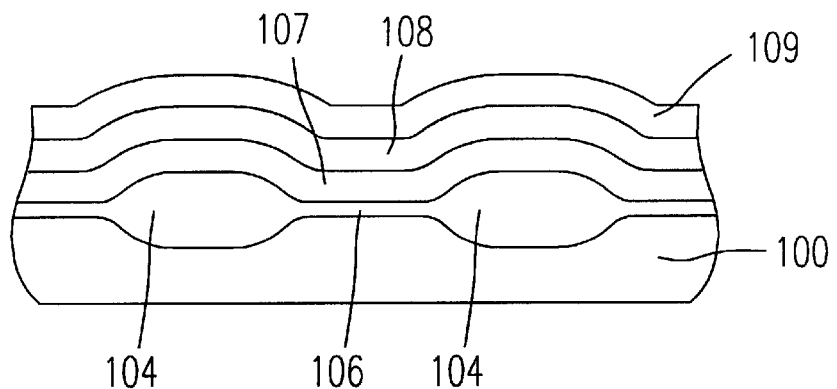
Figure 1F:
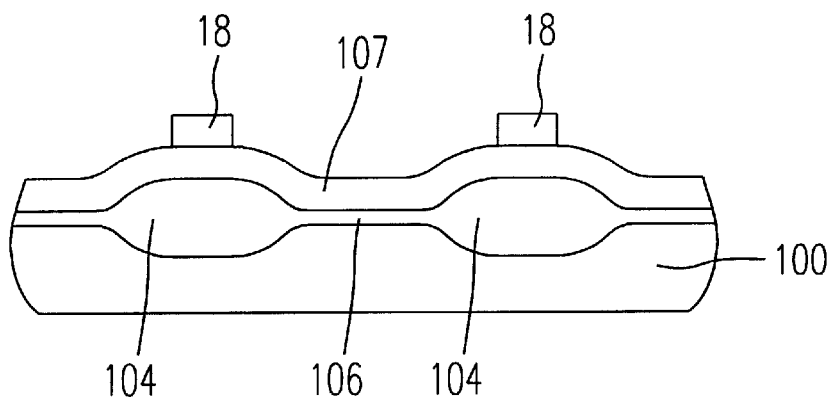
Figure 1G:
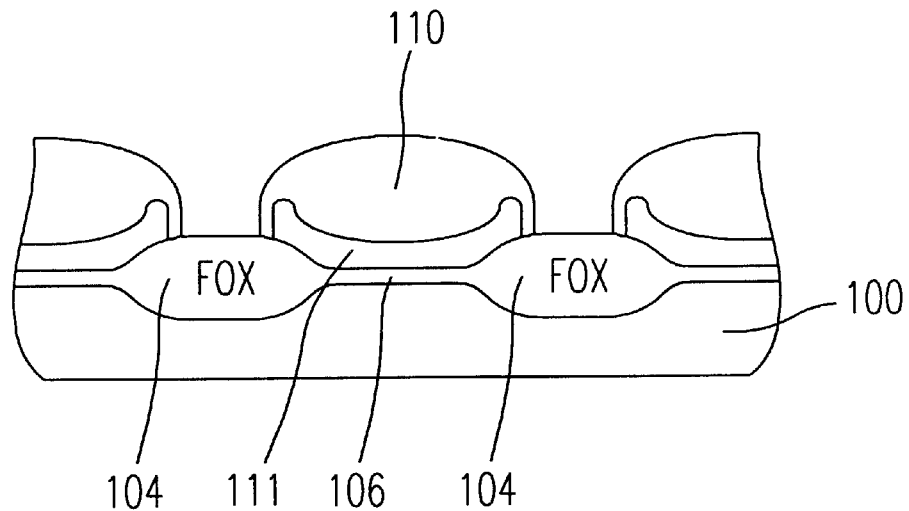
Figure 1H:
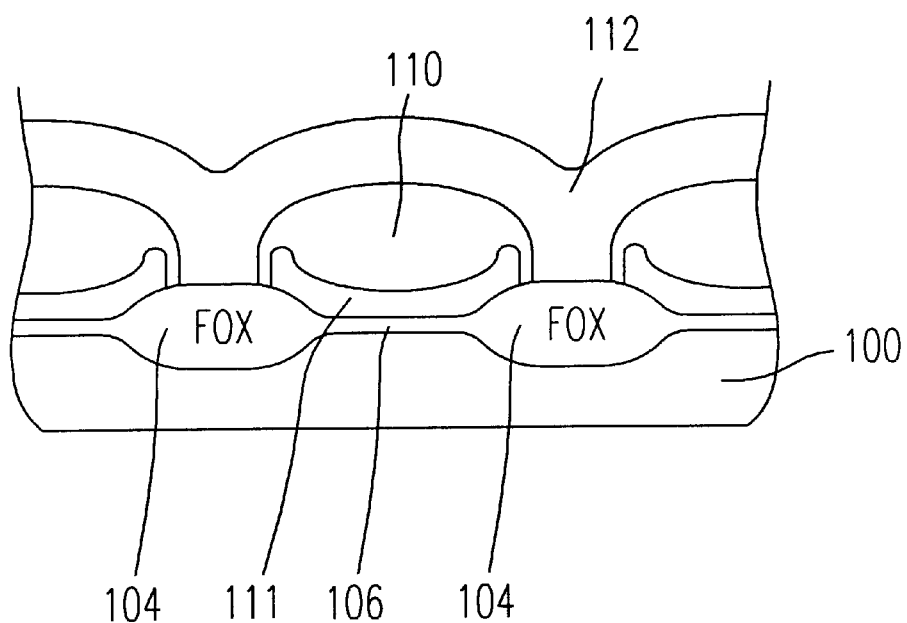
Figure 2:
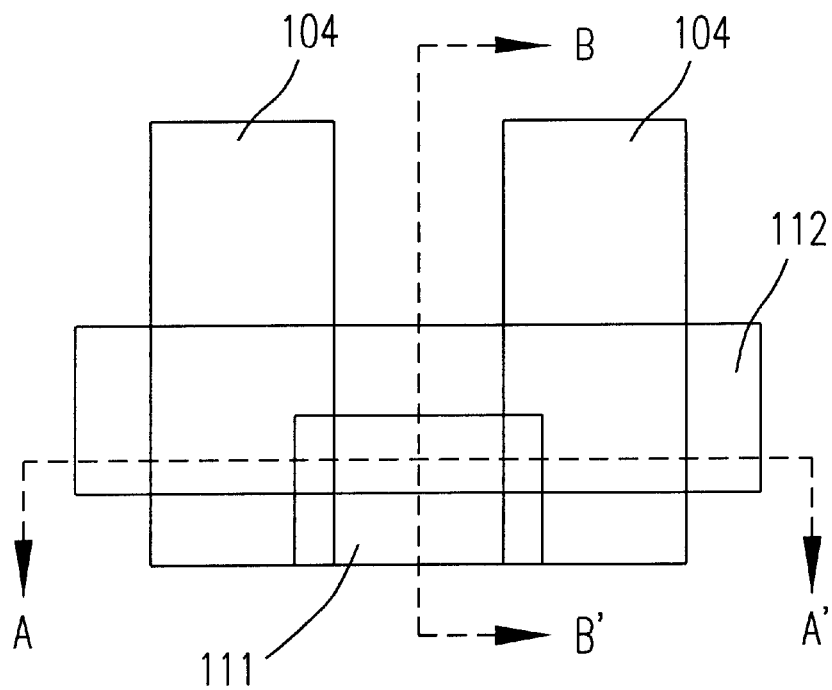
FIG. 2 is a schematic top plane view of the memory structure of FIG. 1.
Figure 3:
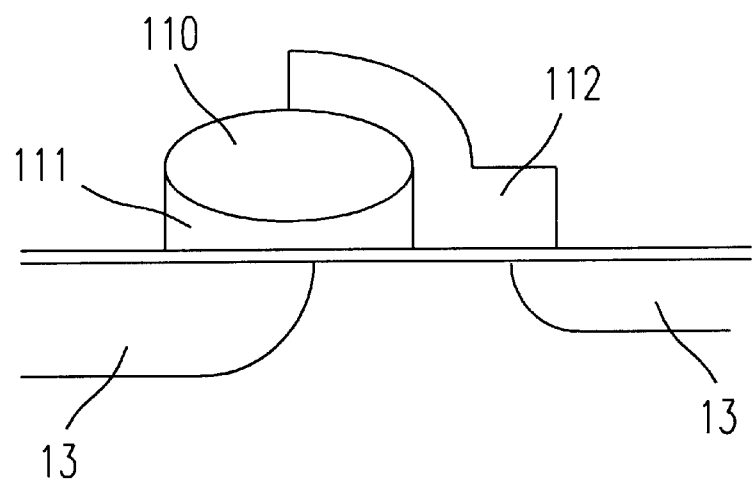
FIG. 3 is another schematic cross-sectional view of the memory structure of FIG. 1 or 2 with source/drain regions formed.
Figure 4A:
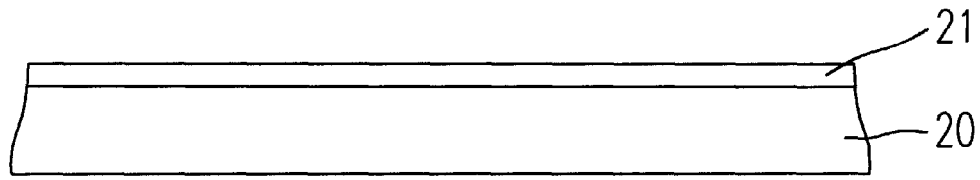
Figure 4B:
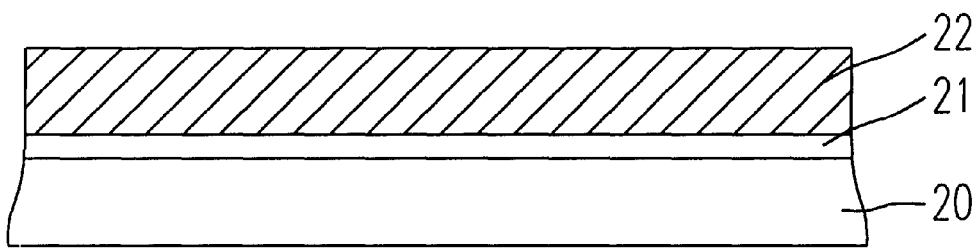
Figure 4C:
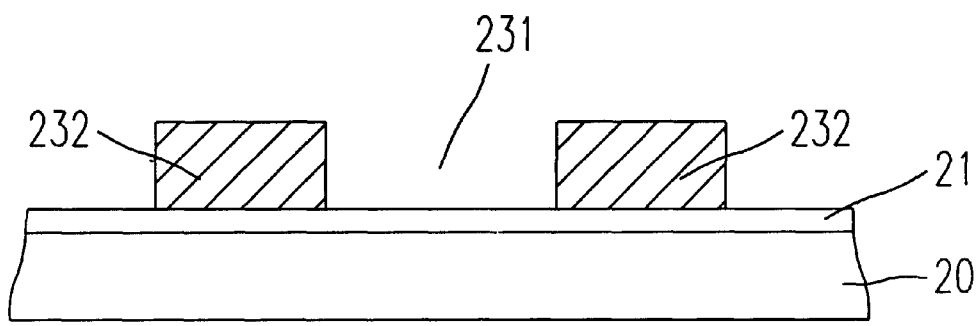
Figure 4D:
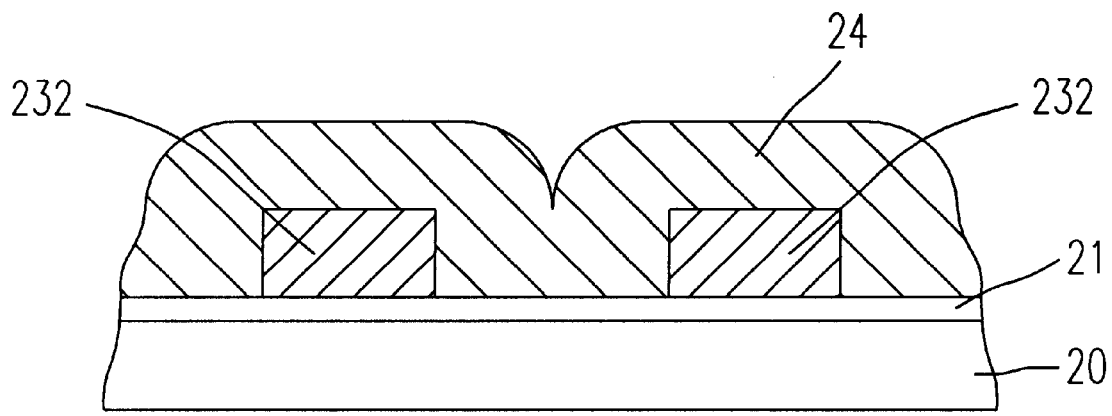
Figure 4E:
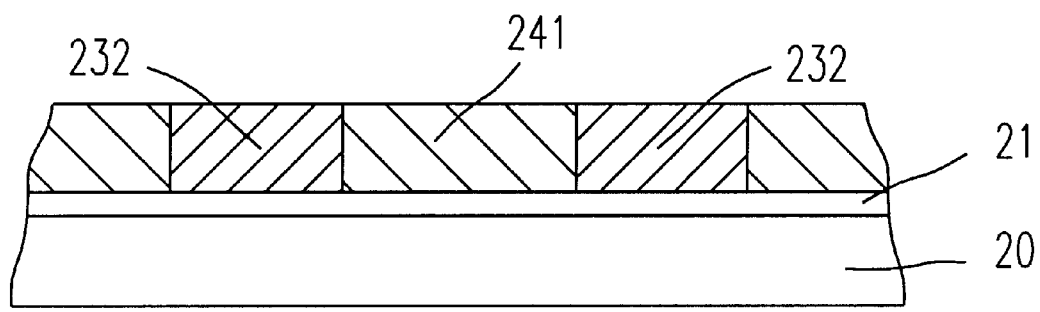
Figure 4F:
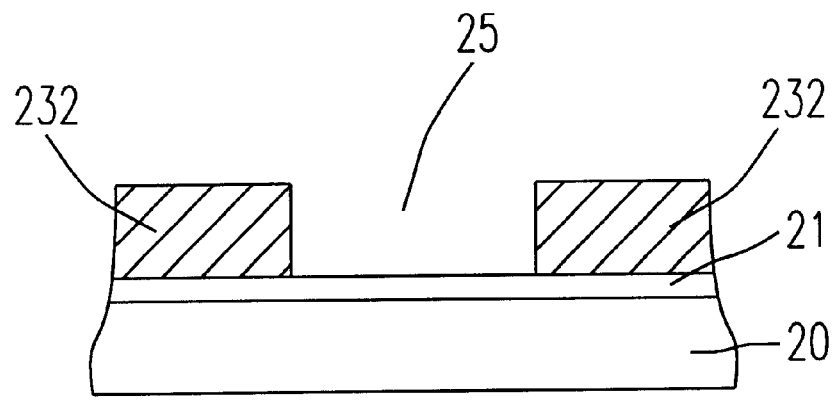
Figure 4G:
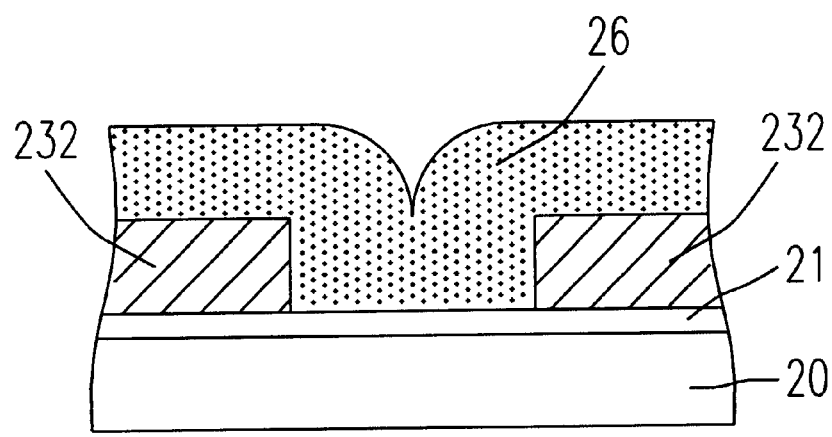
Figure 4H:
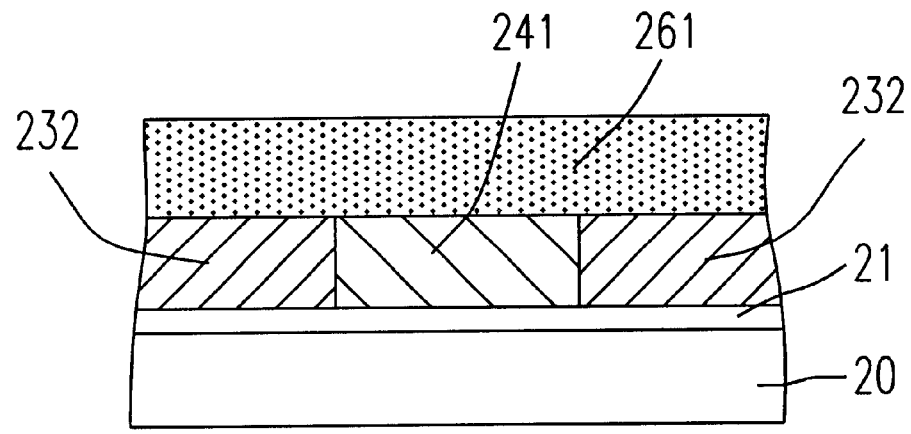
Figure 4I:
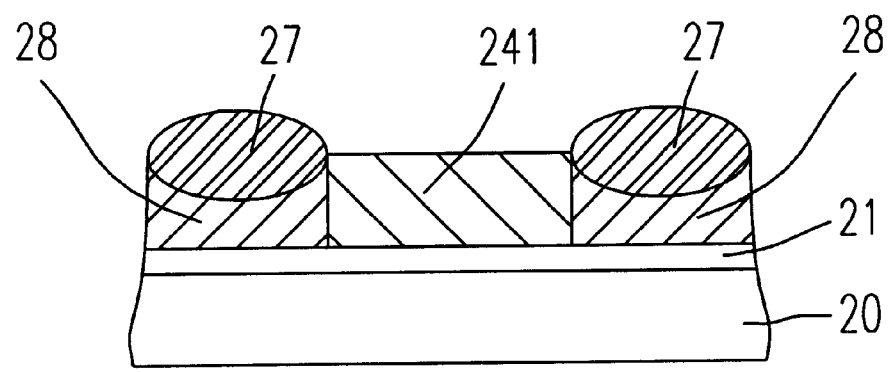
Figure 4J:
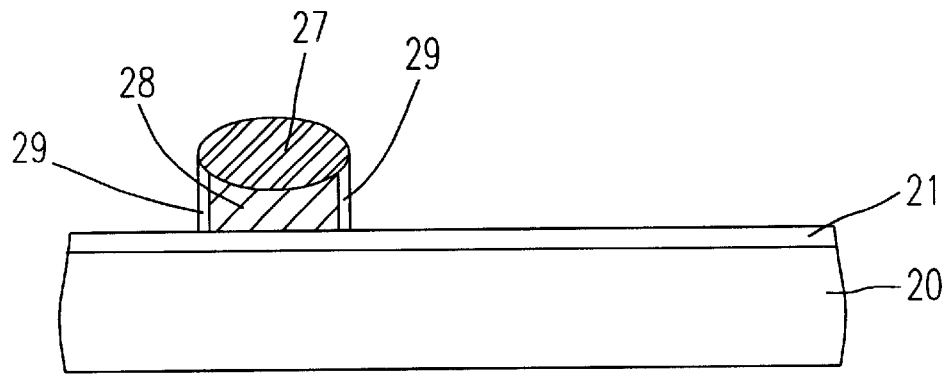
Figure 4K:
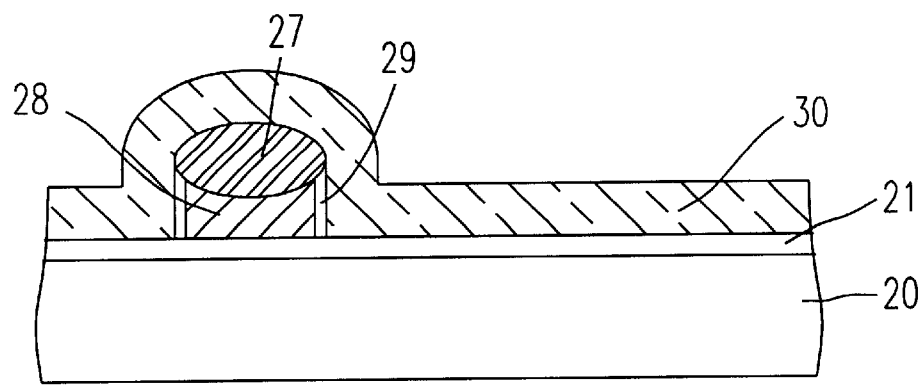
Figure 4L:
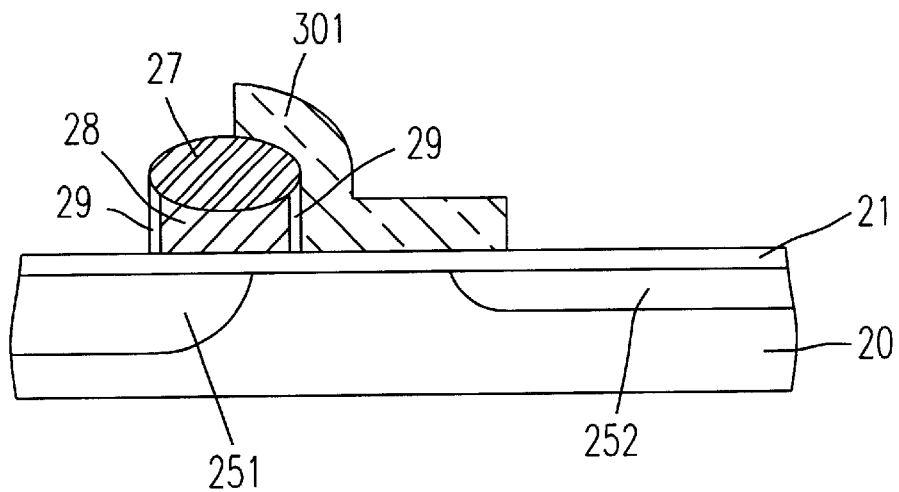
Figure 5A:
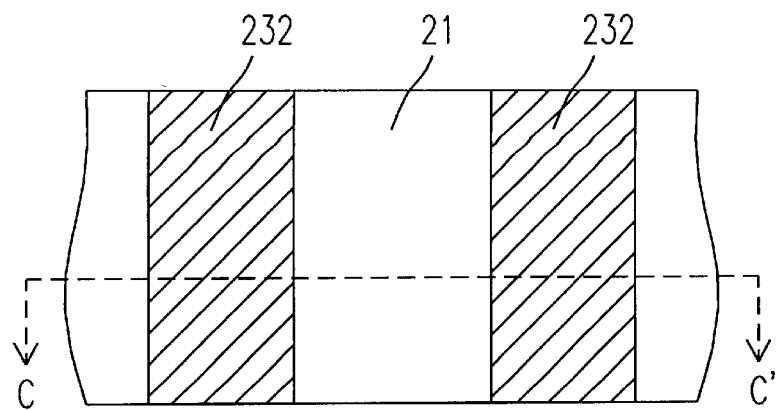
FIGS. 5A~5G are schematic top plane views of intermediate structures of the flash memory corresponding to FIG. 4.
Figure 5B:
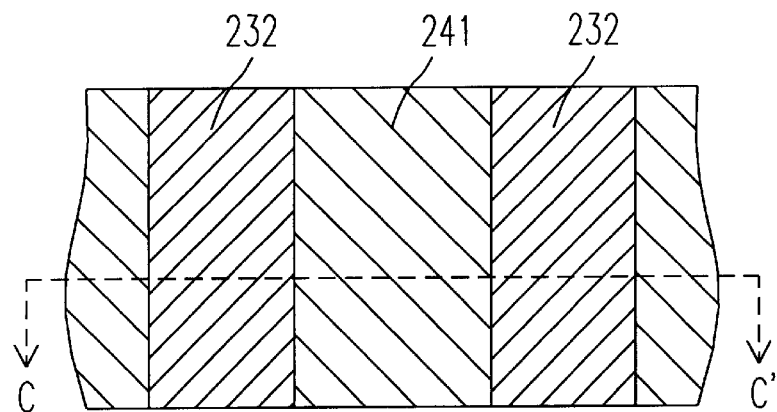
Figure 5C:
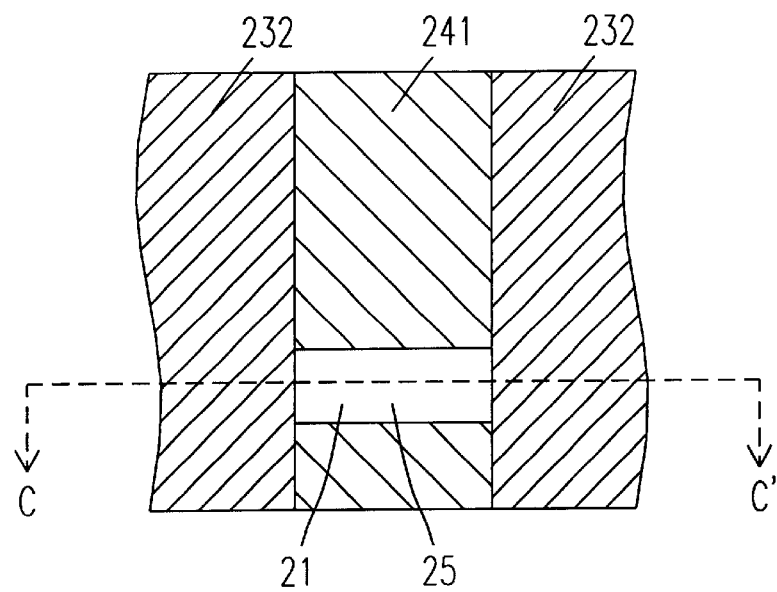
Figure 5D:
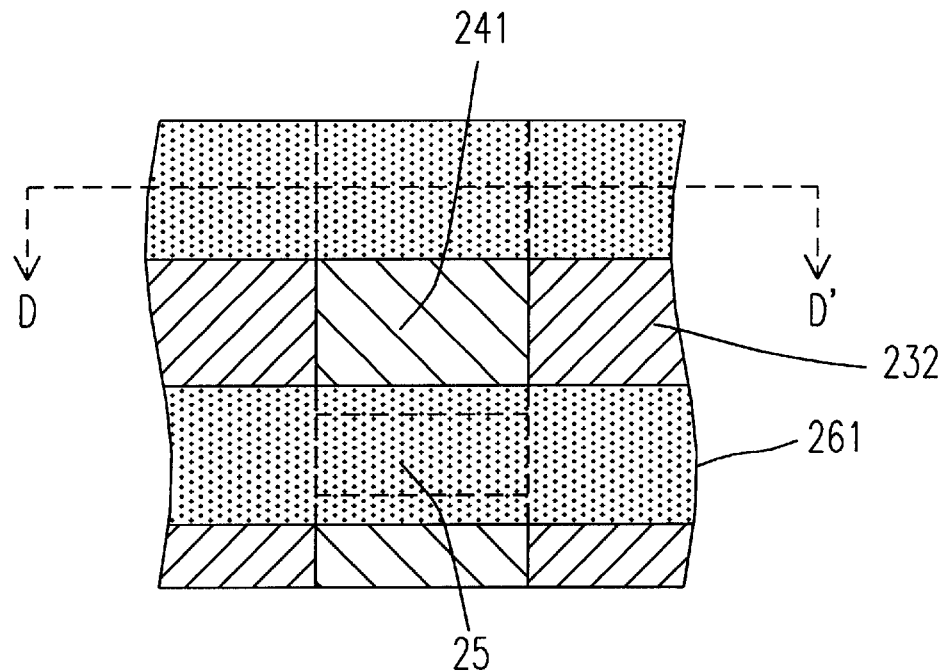
Figure 5E:
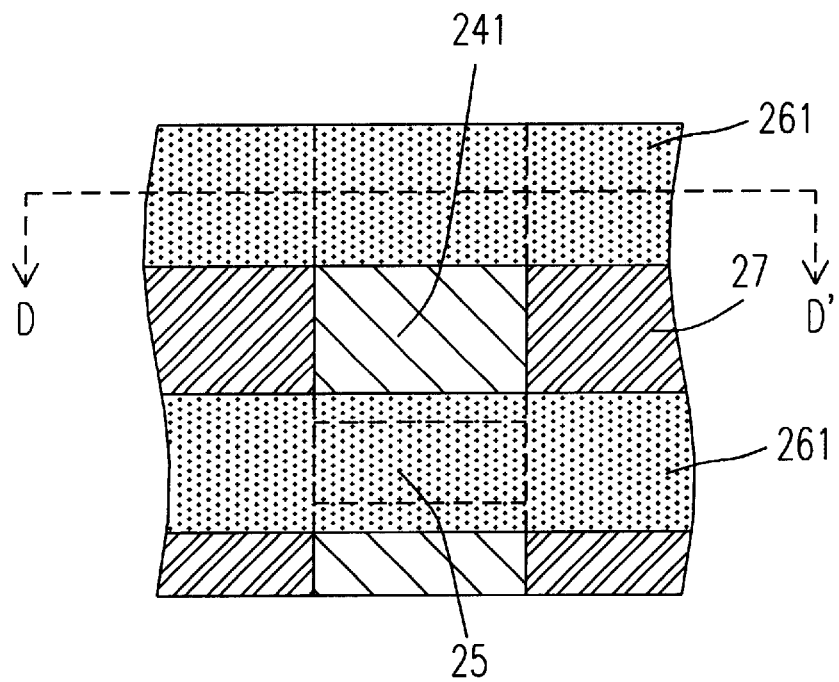
Figure 5F:
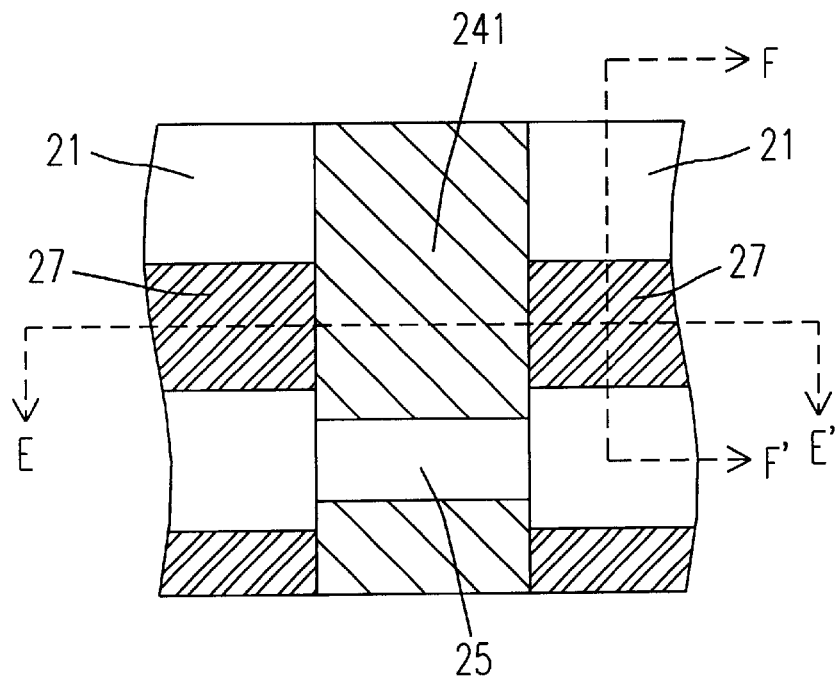
Figure 5G:
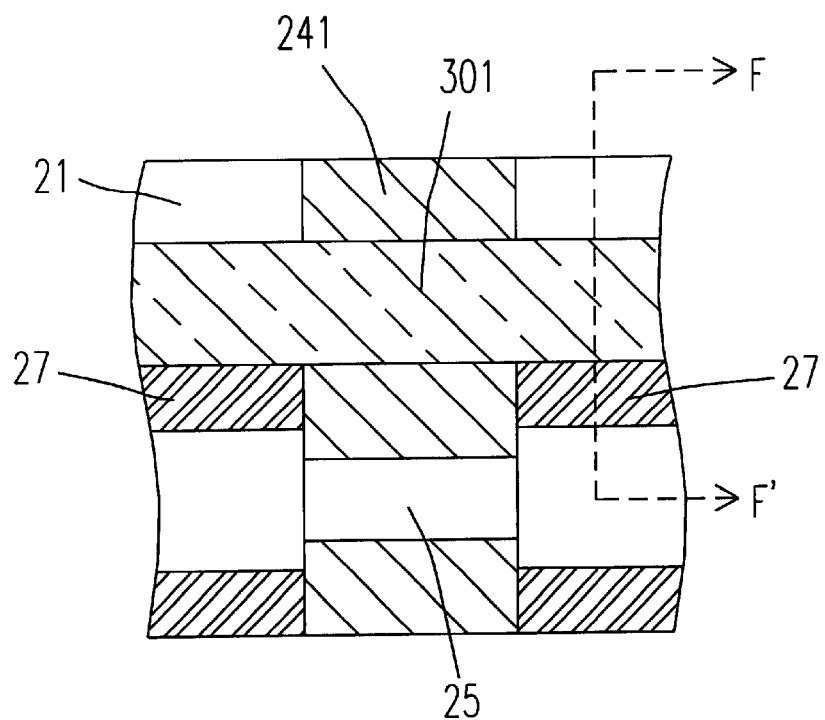

Please refer to FIGS. 4 and 5 which schematically show the formation of a flash memory according to a preferred embodiment of the present invention. First of all, an silicon oxide layer 21 is formed on a silicon substrate 20 as a tunnel dielectric layer, as shown in FIG. 4A. A doped polysilicon layer 22 is then applied onto the structure of FIG. 4A as a first conductive layer, as shown in FIG. 4B. The doped polysilicon layer 22 is treated by a masking and lithography procedure to include alternate trench portion 231 and conductive portion 232, as shown in FIGS. 4C and 5A wherein FIG. 4C is a cross-sectional view taken along a C–C' line of FIG. 5A. The conductive portion 232 will be used to form a floating gate structure. A silicon oxide layer 24 is then applied onto the structure of FIG. 4C as a first insulating layer by chemical vapor deposition to fill the trench portion 231, as shown in FIG. 4D. A channel-stop-implant procedure is performed (not shown), and followed by a chemical mechanical polishing procedure which is performed to planarize the silicon oxide layer 24. Accordingly, an insulating portion 241 adjacent to the conductive portion 232 is formed as a field oxide structure for isolating each memory unit and has a thickness substantial equal to the thickness of the conductive portion 232, as shown in FIG. 4E and 5B wherein FIG. 4E is a cross-sectional view taken along the C–C' line of FIG. 5B. In order to define a source region 251 (FIG. 4L) on the substrate 20, the planarized layer or so-called as a floating gate layer 241+232 is further treated by a masking and lithography procedure to create an implanting window 25 in the insulating portion 241 for ion-implantation therethrough, as shown in FIGS. 4F and 5C wherein FIG. 4F is a cross-sectional view taken along the C–C' line of FIG. 5C. Afterwards, the defined source region is subjected to a source oxidation and an oxide dip-back procedures (not shown). A silicon nitride layer 26 is applied onto the structure of FIG. 4F, as shown in FIG. 4G, and then subjected to a masking and lithography procedure to form a patterned mask 261, as shown in FIGS. 4H and 5D wherein FIG. 4H is a cross-sectional view taken along a D–D' line of FIG. 5D. Under the shield of the mask 261, a thermal oxidation procedure is performed so that the masked part of the conductive portion 232 is protected from reaction, but the unmasked part is transformed into a top-insulated conductive structure, i.e. a second insulating layer 27 is formed, as shown in FIG. 5E. Then, the mask 261 and the masked part of the conductive portion 232 are removed to form a floating gate structure 28, as shown in FIGS. 4I and 5F wherein FIG. 4I is a cross-sectional view taken along an E–E' line of FIG. 5F. After the isolated floating gate structure 28 is formed, a spacer structure 29 formed of silicon nitride is provided around the floating gate structure 28 for insulation, as shown in FIG. 4J which is a cross-sectional view taken along an F–F' line of FIG. 5F. Another doped polysilicon layer 30 is applied onto the structure of FIG. 4J as a second conductive layer or so-called as a control gate layer, as shown in FIG. 4K. The doped polysilicon layer 30 is patterned and etched to form a control gate structure 301, as shown in FIG. 5G, and then a deep source junction implant, a source drive-in and a drain $n^+$ implant procedures are performed to complete the source and drain regions 251 and 252, as shown in FIG. 4L which is a cross-sectional view taken along the F–F' line of FIG. 5G.

According to the above process, the insulating portion 241 serving as the field oxide structure, and the conductive portion 232 serving as the floating gate structure are arranged side by side in a way that the field oxide structure is "self-aligned" with the floating gate structure. Therefore, the possible mis-alignment of the field oxide structure and the floating gate structure resulting from different masking steps in the prior art will not occur in the present process. Further, it is not necessary to remain any clearance between the floating gate structure and the field oxide structure so that the integration of the device can be improved. On the other hand, according to the present invention, the thickness of the floating gate structure is substantially equal to that of the field oxide structure. Therefore, the coupling effect between the floating gate structure and the control gate structure, and thus the voltage for a programming or erasing operation can be reduced. In brief, the process according to the present invention can be used to produce various types of memories, e.g. a flash memory, to result in a relatively high source coupling ratio and a relatively low floating gate/control gate coupling ratio. Consequently, the produced memory unit will have a relatively low programming voltage and erasing voltage.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A process for producing a memory structure, comprising steps of:

providing a substrate;

sequentially applying a tunnel dielectric layer and a first conductive layer onto said substrate;

creating a trench in said first conductive layer;

applying a first insulating layer onto said first conductive layer, which fills said trench;

creating an implanting window in said first insulating layer;

defining a source region on said substrate through said implanting window;

applying a masking layer onto said substrate with said first conductive layer, said first insulating layer and said implanting window, and etching said masking layer to form a patterned mask;

reacting a portion of said first conductive layer without the shield of said patterned mask to form a second insulating layer, and removing said patterned mask, and an unreacted portion of said first conductive layer exposed from the shield of said patterned mask, thereby forming a floating gate structure;

forming an insulating spacer structure around said floating gate structure;

applying a second conductive layer onto said substrate with said second insulating layer and said insulating spacer structure, and etching said second conductive layer to form a control gate structure; and defining a drain region on said substrate.

2. The process according to claim 1 wherein said substrate is a silicon substrate.

3. The process according to claim 2 wherein said tunnel dielectric layer is a silicon oxide layer.

4. The process according to claim 1 wherein said first insulating layer is applied onto said first conductive layer by chemical vapor deposition.

5. The process according to claim 4 wherein said first insulating layer is further treated by a planarization procedure.

6. The process according to claim 5 wherein said planarization procedure is performed by chemical mechanical polish.

7. The process according to claim 1 wherein said first conductive layer is a doped polysilicon layer.

8. The process according to claim 7 wherein said masking layer is a silicon nitride layer.

9. The process according to claim 8 wherein said second insulating layer is formed by a thermal oxidation procedure of said portion of said first conductive layer without the shield of said patterned mask.

10. The process according to claim 7 wherein said insulating spacer structure is formed of silicon nitride.

11. The process according to claim 1 wherein said second conductive layer is a doped polysilicon layer.

12. A process for producing a memory structure, comprising steps of:

providing a substrate;

applying a tunnel dielectric layer onto said substrate;

applying a first conductive layer onto said tunnel dielectric layer, which is trenched to include alternate trench portion and conductive portion;

filling said trench portion with a first insulating material to form a first insulating structure beside said conductive portion;

removing a portion of said first insulating structure to create an implanting window through which ion-implantation is performed to define a source region;

masking said conductive portion according to a predetermined pattern, and transforming said un-masked conductive portion into a top-insulated conductive portion;

removing said masked conductive portion to isolate said top-insulated conductive portion to form a floating gate structure;

forming an insulating spacer structure around said floating gate structure;

applying a second conductive layer over said floating gate structure, which is patterned to form a control gate structure; and defining a drain region on said substrate.

13. The process according to claim 12 wherein said un-masked conductive portion is transformed into a top-insulated conductive portion by a thermal oxidation procedure.

14. A process for producing a memory structure, comprising steps of:

providing a substrate;

applying a tunnel dielectric layer onto said substrate;

forming a floating gate layer on said tunnel dielectric layer, which includes alternate insulating portion and conductive portion of substantially equal thickness;

creating an implanting window in said insulating portion for performing ion-implantation therethrough to define a source region;

removing a first portion of said conductive portion to form a floating gate structure;

providing an insulating structure around said floating gate structure;

applying a control gate layer over said floating gate structure, which is patterned to form a control gate structure; and defining a drain region on said substrate.

15. The process according to claim 14 wherein the formation of said floating gate layer includes steps of:

applying a conductive layer onto said tunnel dielectric layer;

creating a trench in said conductive layer;

forming an insulating layer on said substrate with said trench and said conductive layer, which fills said trench; and performing a polishing procedure to make said insulating portion and said conductive portion have a substantially equal thickness.

16. The process according to claim 14 wherein said insulating structure around said floating gate structure includes:

a top insulating portion formed by thermal oxidation of a second portion of said conductive portion before said first portion of said conductive portion is removed; and a spacer insulating portion formed beside said second portion of said conductive portion after said first portion of said conductive portion is removed.

* * * * *